United States Patent [19]
Kessler et al.

[11] 4,023,118
[45] May 10, 1977

[54] SUPERHETEROJUNCTION LASER

[75] Inventors: Bernard V. Kessler, Greenbelt; Gerald F. Hoff, Ashton, both of Md.

[73] Assignee: The United States of America as represented by the Secretary of the Navy, Washington, D.C.

[22] Filed: Mar. 24, 1975

[21] Appl. No.: 561,461

[52] U.S. Cl. .......................... 331/94.5 H; 148/173; 357/18

[51] Int. Cl.² ..................... H01S 3/00; H01L 33/00

[58] Field of Search .............. 331/94.5 H; 357/17, 357/18; 148/1.5, 171, 172, 173

[56] References Cited

UNITED STATES PATENTS

| | | | |
|---|---|---|---|
| 2,950,219 | 8/1960 | Pohl | 148/173 X |
| 3,514,715 | 5/1970 | Kosonocky | 331/94.5 H |
| 3,737,737 | 6/1973 | Heywang et al. | 331/94.5 H X |
| 3,882,533 | 5/1975 | Dohler | 357/17 X |

OTHER PUBLICATIONS

Zory et al, *Superlattice Surface Laser*, IBM Technical Disclosure Bulletin, vol. 15, No. 1, June 1972, p. 163.

*Primary Examiner*—Eugene La Roche
*Attorney, Agent, or Firm*—R. S. Sciascia; A. L. Branning; R. E. Bushnell

[57] ABSTRACT

A superheterojunction (SHJ) laser constructed from periodic structural semiconductor materials. The SHJ laser has approximately a thousand junctions which are planar and layered to provide gain in the plane of the layers. In addition, the device allows beam narrowing and beam steering of its output signal due to the multiple number of output sources with the ability to control the output phase of the combined sources.

11 Claims, 2 Drawing Figures

SUPERHETEROJUNCTION LASER

BACKGROUND OF THE INVENTION

The present invention pertains generally to semiconductor lasers and more particularly to multiple heterojunction lasers. Early semiconductor lasers were constructed to produce lasing action in single p-n junctions of GaAs. These semiconductor lasers operated only at cryogenic temperatures and produced low output power in the plane of the junction. More recently, room temperature semiconductor lasers have been fabricated using double heterojunctions of high refractive index GaAs surrounded by low refractive index AlGaAs. Since optical gain occurs in the center GaAs layer, good optical confinement is obtained. However, the power output is limited since lasing occurs in the small volume of a single p-n junction. In addition, the beam produced by the double heterojunction laser is geometrically poor since it is planar and has large divergence due to diffraction from the narrow planar emitting junction. Moreover, the double heterojunction is constructed by growing several epitaxial layers. This method of fabrication leads to strains and microcracks which form regions of high absorption and limit the lifetime of the device. These imperfections can be avoided only by expensive and delicate fabrication methods.

SUMMARY OF THE INVENTION

The present invention overcomes the disadvantages and limitations of the prior art devices by providing a superheterojunction laser. The superheterojunction laser is constructed from a cylindrical boule in which a multiple number of p-n junctions are formed from striations formed in the boule as it is grown. Impurity atoms, such as Yb, form an n-type material which is interspersed at regular intervals as short as 10 microns between the remaining p-type material, such as PbTe.

It is therefore an object of the present invention to provide an improved semiconductor laser.

It is also an object of the present invention to provide a semiconductor laser having high power output.

Another object of the present invention is to provide a semiconductor laser which has good beam geometry.

Another object of the present invention is to provide a semiconductor laser for producing a steerable output beam.

Another object of the present invention is to produce a semiconductor laser having a long lifetime and which can be easily and inexpensively fabricated.

Other objects, advantages and novel features of the invention will become apparent from the following detailed description of the invention when considered in conjunction with the accompanying drawings wherein:

DETAILED DESCRIPTION OF THE PREFERRED EMBODIMENT

Figure 1:
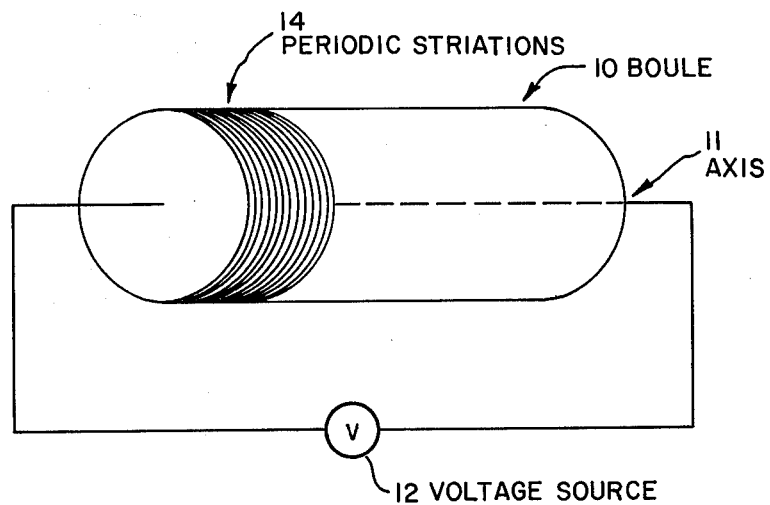
FIG. 1 discloses a perspective view of the semiconductor boule of the present invention.

FIG. 1 discloses a perspective view of a semiconductor boule 10 forming the device of the preferred embodiment. The boule 10 contains a series of periodic striations 14 which are formed in planes perpendicular to the axis 11 of the boule. The striae 14 are formed all along the length of the boule as schematically shown in both FIG. 1 and FIG. 2 and completely through the width of material so as to form a series of laminae, on planes arranged in stacked layers. The striations 14 in the present device constitute variations in the PbTe/Yb ratio along the growth axis, i.e, the axis 11 of the boule 10. These stacked layers of striations are grown to form a series of p-n junctions by using the Czochralski technique.

Figure 2:
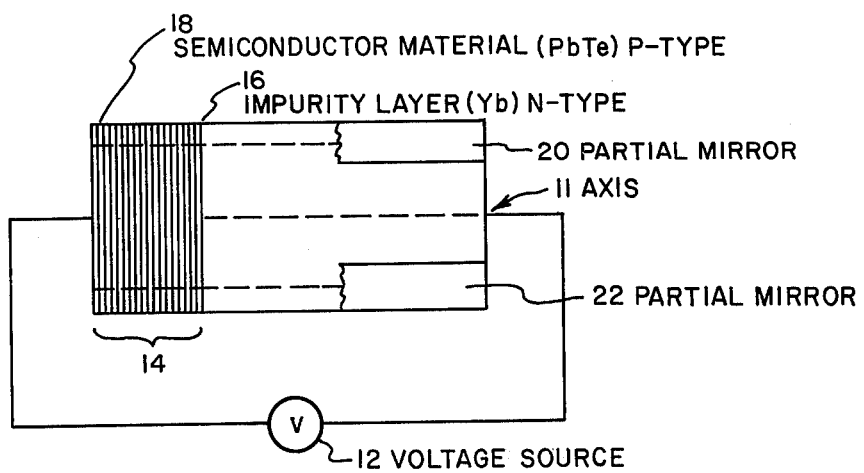
FIG. 2 discloses a side view of the semiconductor boule.

As grown, PbTe forms a p-type semiconductor whereas PbTe+ 1%Yb($Pb_{.99}Yb_{.01}Te$) forms an n-type semiconductor. By growing the boule 19 according to the Czochralski technique, the striations are formed containing the impurity atom, Yb(n-type) while the region between the striation contains PbTe(p-type). The variation in the distance between the striations is controlled by the rate that the crystal is pulled from the melt as well as the frequency of superimposed ultrasonic oscillations in the melt. Striations formed by ultrasonic oscillations have been found to be extremely regular with spacings as short as ten microns. A one centimeter boule could therefore contain as many as a thousand p-n junctions. Application of a voltage to the series of junctions by a voltage source 12 would normally not cause the p-n junctions to lase since half the junctions are back biased, thus preventing injection current from flowing. By applying a higher voltage however, the back biased junctions are forced to "break down" into a Zener mode to allow the injection current to flow through the entire superheterojunction structure resulting in laser action supported by the forward biased junctions. Since there is gain in the planes of the junctions (planes perpendicular to the axis 11 of the boule) the device will emit a series of laser beams in those planes when the outside surface of the boule is coated on top and bottom by partial mirrors 20 and 22 respectively. The partial mirrors extend along the entire length of the boule as schematically shown in FIG. 2 as do the striation layers 14.

A primary advantage of the present device is its ability to project a laser beam having good beam geometry. In the double heterojunction, as in the present device, each beam is propagated from a narrow planar emitting junctions which causes the beam to diffract. In the present device however, the phase fronts of each of the beams are summed such that a narrow output beam is produced in much the same way as a linear array of phased antenna elements. It is therefore possible to sweep or steer the beam produced by the superheterojunction laser just as it is in an antenna array by varying the wavelength of the drive current produced by voltage source 12. This places different potentials on each of the junctions at any particular point in time to affect a progressive change in phase traveling along the length of the boule 10.

Another advantage of the superheterojunctions laser over conventional double heterojunctions lasers is its longer lifetime due to lack of strains produced in the semiconductor material. The semiconductor boule of the superheterojunction laser is pulled continuously from the melt without breaking vacuum, in the presence of a strong standing wave ultrasonic field aligned along the axis 11 of the boule. The junctions are therefore not exposed to air or even imperfect vacuum as is required in the construction of the double heterojunction laser which consists of compound liquid epitaxy layers grown in time sequence in imperfect conditions producing such stains and limiting its lifetime.

The superheterojunction laser therefore provides a semiconductor laser which has greater power output, better beam geometry, and a steerable output beam, due to its multiple number of planar emitting junctions. In addition, the superheterojunction laser can be easily and inexpensively fabricated to provide a more durable device having a longer lifetime.

Obviously many modifications and variations of the present invention are possible in light of the above teachings. For example, other semiconductors such as InSb doped with Te as an impurity can also be grown with striations. The Te precipitates out, i.e., segregates and forms the periodic striations. In addition, any suitable configuration of mirrors could be used to form the desired beam geometry. Also, the boule can take any form necessary for any desired application. It is therefore to be understood that with the scope of the appended claims the invention may be practiced otherwise than as specifically described.

What is claimed as new and desired to be secured by Letters Patent of the United States is:

1. An improved semiconductor laser comprising:
    a boule of semiconductor material;
    periodic striation layers of impurity ions formed in said boule by the application of an ultrasonic signal in densities sufficient to create P-N junctions at said layers while said boule is pulled at a fixed rate from a melt containing P-type and N-type conductivity impurity ions;
    voltage source means connected axially to opposite ends of said boule for applying an electrical voltage having a magnitude sufficient to generate an injection current through said boule to cause said P-N junctions to lase.

2. The device set forth in claim 1 further comprised of: said striation layers being spaced by ten microns.

3. The laser of claim 1 wherein said impurity atoms comprise Yb.

4. The laser of claim 1 wherein said semiconductor material of said boule comprises PbTe.

5. The laser of claim 4 wherein said impurity atoms comprise Yb.

6. A superheterojunction laser device for producing a combined laser beam having good geometric confinement and which can be steered in space, comprising:
    a boule of semiconductor material;
    periodic striated layers of impurity ions formed in said boule in densities sufficient to create P-N junctions at each of the layers by the application of a standing wave ultrasonic field of predetermined frequency aligned along the direction of movement while said boule is pulled at a predetermined rate from a melt containing P-type and N-type conductivity impurity ions whereby the periodic striae form a multiplicity of P-N junctions;
    partial mirror means covering at least part of said cylindrical boule;
    variable frequency voltage source means in excess of the Zener voltage of said P-N junctions connected across opposite axial ends of said boule for causing an injection current signal to flow through said multiplicity of P-N junctions causing the forward biased of said junctions to produce a signal laser output
    bean coplanar with its junction source such that the combination of single laser output beams produces a narrow combined laser beam;
    wherein said injection current signal produced by said variable voltage source can be varied in wavelength to progressively change the phase of said injection current signal at each of said multiplicity of P-N junctions to effect a steering of said narrow combined laser beam.

7. The device of claim 6 wherein said boule is formed of InSb and said impurity material comprises Te.

8. The device of claim 6 wherein said boule is formed of PbTe and said impurity material comprises Yb.

9. The device set forth in claim 6 further comprised of: said striae being spaced by ten microns.

10. A method of producing a laser beam, comprising the steps of:
    forming a boule of semiconductor material by pulling the material from a melt containing n-type and p-type conductivity impurity ions at a selected rate while applying an ultrasonic signal to said semiconductor material to create a multiplicity of periodic striated layers of impurity atoms to form p-n junctions between said layers;
    coating opposite arcuate segments of said boule longitudinally with partial mirrors;
    applying a voltage across opposite bases of said boule having sufficient magnitude to cause an injection current to flow through said boule whereby the forward biased of said p-n junctions lase.

11. The device set forth in claim 10 further comprised of:
    said striated layers having a closeness of one thousand per centimeter of boule length.

* * * * *